United States Patent [19]

Akagiri et al.

[11] Patent Number: 5,757,938

[45] Date of Patent: *May 26, 1998

[54] HIGH EFFICIENCY ENCODING DEVICE AND A NOISE SPECTRUM MODIFYING DEVICE AND METHOD

[75] Inventors: Kenzo Akagiri, Kanagawa; Makoto Akune, Tokyo, both of Japan

[73] Assignee: Sony Corporation, Tokyo, Japan

[*] Notice: The term of this patent shall not extend beyond the expiration date of Pat. No. 5,

[21] Appl. No.: 439,089

[22] Filed: May 8, 1995

Related U.S. Application Data

[62] Division of Ser. No. 142,873, Oct. 28, 1993.

[30] Foreign Application Priority Data

Oct. 31, 1992 [JP] Japan .................................. 4-316266

[51] Int. Cl.$^6$ ............................................ H03G 5/00
[52] U.S. Cl. .......................... 381/98; 381/106; 375/243; 375/346; 375/350; 395/2.35; 395/2.36; 395/2.38; 395/2.39
[58] Field of Search .......... 381/98, 106; 395/2.35–2.39, 395/2.29; 375/243, 244, 346, 348, 350

[56] References Cited

U.S. PATENT DOCUMENTS 5,204,677 4/1993 Akagiri et al. .

5,563,913 10/1996 Akagiri et al. .

FOREIGN PATENT DOCUMENTS

A30466190 1/1992 European Pat. Off. .

Primary Examiner—Curtis Kuntz
Assistant Examiner—Duc Nguyen
Attorney, Agent, or Firm—Jay H. Maioli

[57] ABSTRACT

An apparatus and method for processing an input digital signal in which an input digital audio signal at an input terminal 11 is supplied via a one-block delay unit 17 to a difference unit 20, an output of which is processed by a noise-shaping circuit 21 and restored by a near-instantaneous compressor 26, a near-instantaneous expander 27 and an accumulator 28 so as to be fed back to the difference unit 20 to find a difference between a signal of a directly preceding sample and a signal of the current sample. The noise shaping circuit 21 modifies the spectrum of the quantization noise by taking aural characteristics, such as equal-loudness characteristics or masking characteristics, into account for diminishing the level of the quantization noise as perceived by the ear. The noise level as perceived may be reduced in a manner desirable for the sound quality without changing the existing format.

20 Claims, 13 Drawing Sheets

| BANDWIDTH NUMBERS (Bark) | CENTER FREQUENCIES (Hz) | BANDWIDTHS (Hz) |
|---|---|---|
| 1 | 50 | 80 |
| 2 | 150 | 100 |
| 3 | 250 | 100 |
| 4 | 350 | 100 |
| 5 | 450 | 110 |
| 6 | 570 | 120 |
| 7 | 700 | 140 |
| 8 | 840 | 150 |
| 9 | 1000 | 160 |
| 10 | 1170 | 190 |
| 11 | 1370 | 210 |
| 12 | 1600 | 240 |
| 13 | 1850 | 280 |
| 14 | 2150 | 320 |
| 15 | 2500 | 380 |
| 16 | 2900 | 450 |
| 17 | 3400 | 550 |
| 18 | 4000 | 700 |
| 19 | 4800 | 900 |
| 20 | 5800 | 1100 |
| 21 | 7000 | 1300 |
| 22 | 8500 | 1800 |
| 23 | 10500 | 2500 |
| 24 | 13500 | 3500 |
| 25 | | |

HIGH EFFICIENCY ENCODING DEVICE AND A NOISE SPECTRUM MODIFYING DEVICE AND METHOD

This application is a division of Ser. No. 08/142,873 filed Oct. 28, 1993.

BACKGROUND OF THE INVENTION

This invention relates to a high efficiency encoding device and a noise spectrum modifying device and method for speech or audio signals. More particularly, it relates to a high efficiency encoding device and a noise spectrum modifying device and method of the sub-sampling encoding system, such as MUSE, in which the quantization noise spectrum is rendered aurally acceptable by reducing the noise level as perceived by the ear to improve the quality of the speech or audio signals for high definition telecasting.

As a system for high efficiency encoding of digital audio signals there has hitherto been proposed a system consisting in the combination of differential encoding and near-instantaneous compression. According to the proposed system a difference between two neighboring samples of the digital audio signals is compressed on a block unit basis, by way of near-instantaneous compression, using range information as found based on a maximum value of the difference in a block consisting of a pre-set number of samples.

There has also been disclosed in JP Patent KOKAI Publication No. 63-16718 (1988) a technique in which the difference is found based on a difference between signals of the current sample and signals of a directly previous sample restored by processing with near-instantaneous compression, near-instantaneous expansion and accumulation to correct the errors produced at the time of the range compression.

Such high efficiency encoding system, consisting in the combination of the differential encoding and near-instantaneous compression and expansion (compansion) is employed for encoding audio signals processed with bandwidth compression by the multiple subsampling encoding system, such as MUSE, for telecasting or recording on a recording medium, such as a recording disc, of high definition television signals, such as so-called high-vision signals.

FIG. 1 shows characteristics in the high-efficiency encoding by the above-described conventional combination of the differential encoding and near-instantaneous compansion. In FIG. 1, curves A and B represent an output signal level and a noise level, respectively. Thus it is seen that the S/N ratio is lowered towards higher frequencies at a rate of 6 dB/oct. The quantization noise shows a substantially flat spectrum. The status shown in FIG. 1 is not fully satisfactory as long as the aural sense of human being is concerned, although a minimum noise energy may thereby be achieved.

Above all, the S/N ratio is lowered when the high-range signal is supplied as an input signal.

OBJECT AND SUMMARY OF THE INVENTION

In view of the above-described status of the art, it is an object of the present invention to provide a high efficiency encoding device, a noise spectrum modifying device and method whereby, when encoding audio signals by the combination of the differential encoding and near-instantaneous compansion, the quantization noise as perceived by the ear may be reduced to improve the sound quality without changing the existing format.

For accomplishing the above object, the present invention provides a high efficiency encoding apparatus comprising difference signal outputting means having a local demodulating function, quantization means having a near-instantaneous compansion and noise-shaping means for modifying the spectrum of the quantization noise.

It is preferred for the noise shaping characteristics of the noise shaping means to be substantially the equal-loudness characteristics normalized with the critical bandwidth. It is also preferred for the noise shaping characteristics to be substantially flat for a frequency region not higher than 4 kHz. It is similarly preferred for the noise shaping characteristics of the noise shaping means to be obtained by mixing the characteristics substantially similar to the equal-loudness characteristics normalized with the critical bandwidth and the masking threshold characteristics, while it is also preferred for the masking threshold characteristics to be mixed at a higher proportion with and increase in the input signal level.

Thus the present invention consists of modifying the spectrum of the quantization noise so that the noise as heard by the ears becomes lower. To this end, error feedback may be employed. The equal-loudness characteristics and masking characteristics may be employed for reducing the noise as heard by the ears. The concept of the critical bands may be employed in converting the equal-loudness characteristics into characteristics of the noise spectrum.

According to the present invention, the quantization noise as perceived by the ears may be reduced by taking into account the equal loudness characteristics and masking characteristics by the noise shaping means which modify the spectrum of the quantization noise. That is, the noise level as perceived by the ears may be reduced in a manner desirable for the sound quality without modifying existing formats, such as the speech format for high definition telecasting or recording on the recording medium by the so-called MUSE system or the decoders.

With the high efficiency encoding apparatus according to the present invention, comprising difference signal outputting means having a local demodulating function, quantization means having a near-instantaneous compansion function and noise-shaping means for modifying the spectrum of the quantization noise, the quantization noise as perceived by the ears may be reduced by taking into account the equal-loudness characteristics and the masking characteristics by the noise shaping means which modifies the quantization noise spectrum.

It should be noted that the characteristics of the noise filter provided in the noise shaping means are set on the basis of at least one of the characteristics based on the information of the equal-loudness characteristics and the masking characteristics as obtained from the information derived from the frequency analysis of the input audio signal and, if both of them are employed, a synthesis ratio between the characteristics based on the information of the equal-loudness characteristics and the masking characteristics as obtained from the information derived from the frequency analysis of the input audio signal is set based on the information which is changed depending on the input audio signal level. It becomes possible in this manner to reduce the noise as perceived by the ears to improve the dynamic range as far as the aural sense of the human being is concerned.

Therefore, if the high efficiency encoding device for audio signals according to the present invention is applied to, for example, standardized digital audio equipment, it becomes possible to produce the playback sound having a higher dynamic range than that actually realized under the unified standard as long as the aural sense of the human being is concerned. For example, the dynamic range of the reproduced audio signal as perceived by the ears may be improved under maintenance of the existing unified standard, that is, under maintenance of compatibility without modifying the playback side arrangement.

BRIEF DESCRIPTION OF THE DRAWINGS

FIG. 4 shows typical examples of the relation between the center frequencies of the critical bands and the bandwidth.

DESCRIPTION OF THE PREFERRED EMBODIMENTS

Figure 1:
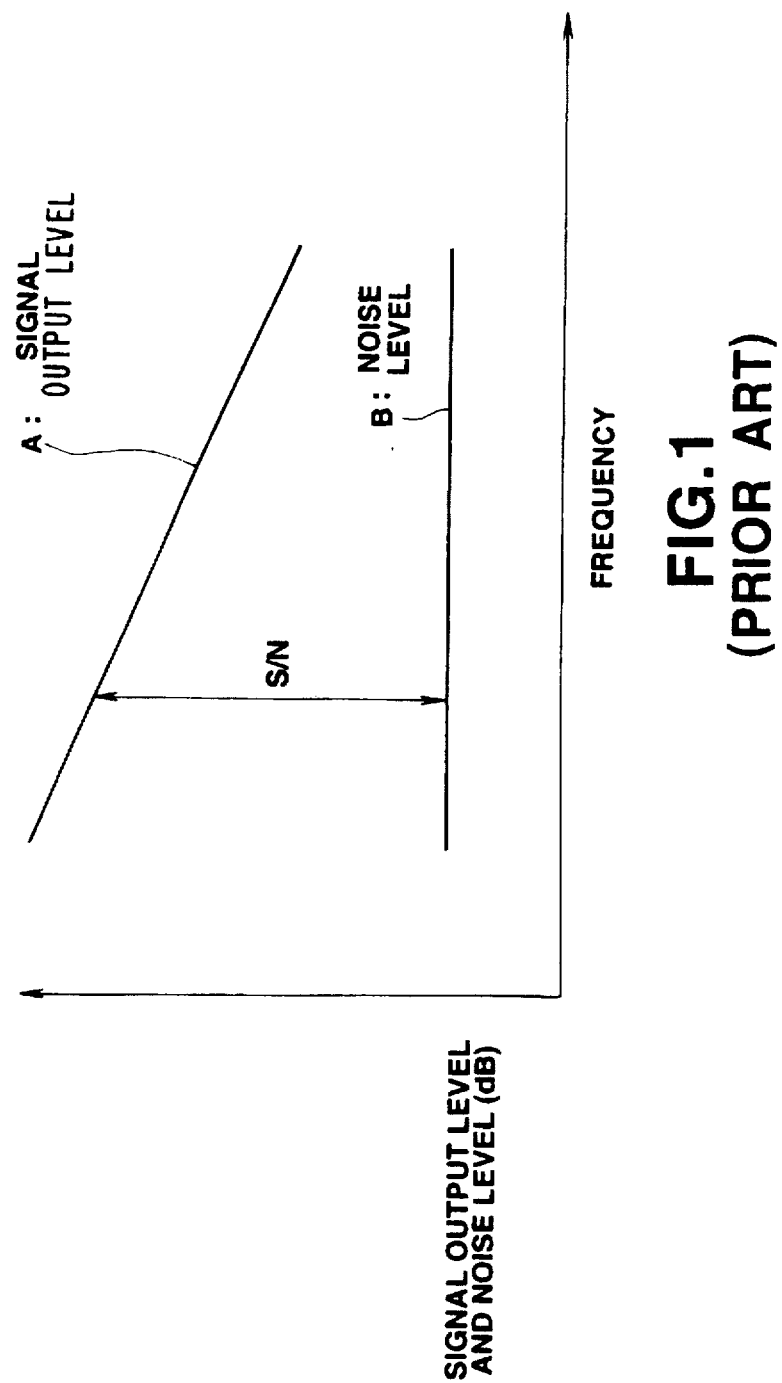
FIG. 1 is a graph showing signal-to-noise characteristics of a conventional high efficiency encoding device for audio signals.

Referring to the drawings, a first embodiment according to the present invention will be explained in detail.

Figure 2:
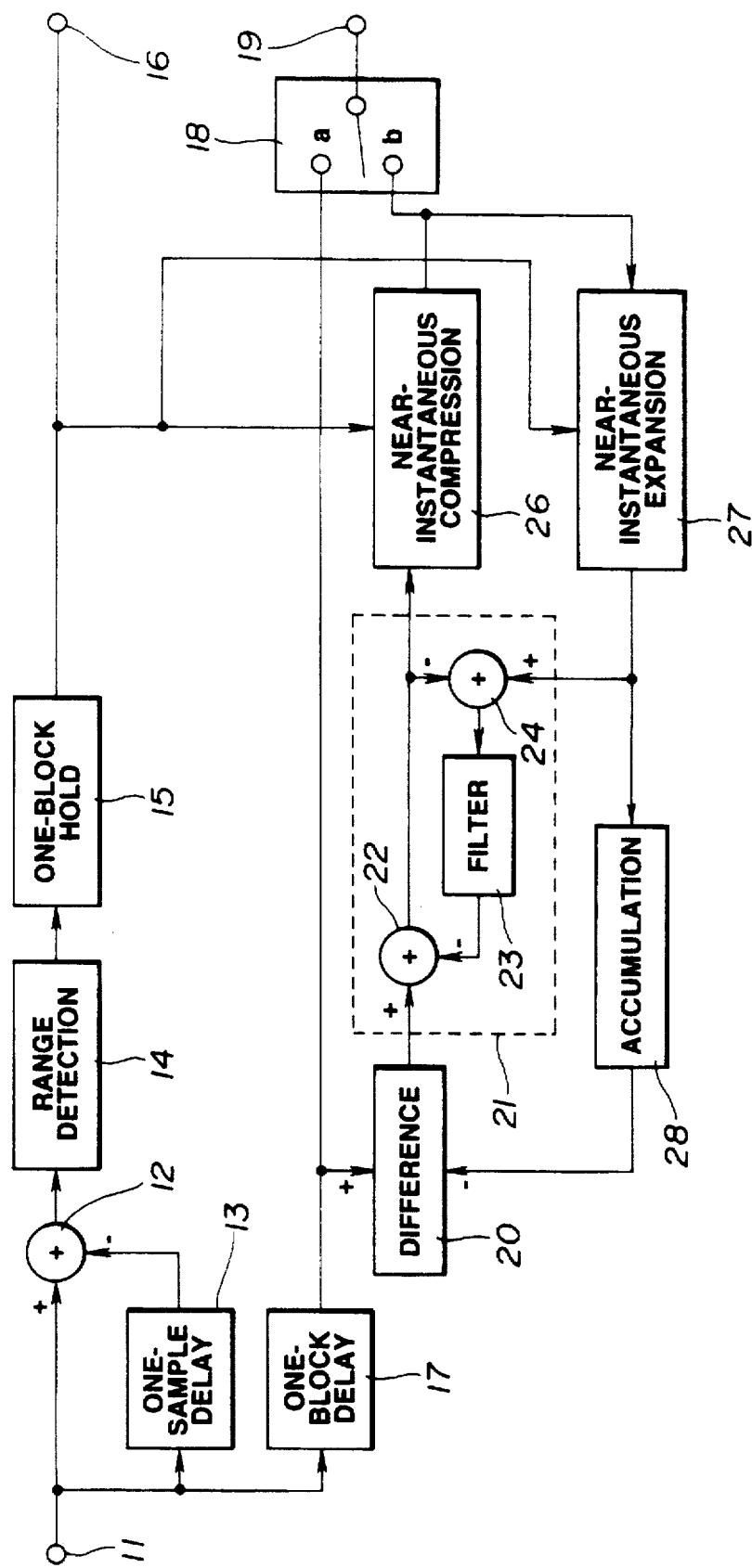
FIG. 2 is a block diagram showing a processing device according to a first embodiment of the present invention.

In FIG. 2, a digital speech or audio signal, supplied to an input terminal 11, is transmitted to a subtractive node 12 and to a one-sample delay unit 13. A delay signal from the one-sample delay unit 13 is transmitted to the subtractive node 12 so that a difference signal between neighboring samples is outputted from the subtractive node 12. The difference signal is transmitted to a range detector 14 for sequentially detecting the signal levels in the course of a given block. The maximum level as detected during the one-block interval is used for determining the compression range of the difference signal for the block. The range signal from the range detector 14 is held for the one-block interval by a one-block holder 15 before being outputted at a range output terminal 16.

The input signal at the input terminal 11 is also delayed by one block by a one-block delay unit 17 and thence supplied via a difference unit 20 to an annexed noise shaping circuit 21 for noise shaping, from which the noise-shaped signal is restored via a near-instantaneous compressor 26, a near-instantaneous expander 27 and an accumulator 28 and thence supplied to the difference unit 20 for difference taking. A delayed output of the one-block delay unit 17 is supplied to a fixed terminal a of a changeover switch 18, while an output signal of the near-instantaneous compressor 26 is transmitted to a fixed terminal b of the changeover switch 18. An output of the changeover switch 18 is issued at a difference signal output terminal 19.

In the first embodiment of the present invention, there is annexed the noise shaping circuit 21 having a subtractive node 24 for finding a difference between an input to the near-instantaneous compressor 26 and an output of the near-instantaneous expander 27 for taking out only the quantization noise which is processed with a filter 23 consisting of a first-order linear coupled circuit before being fed back via an additive (subtractive) node 22.

Figure 3:
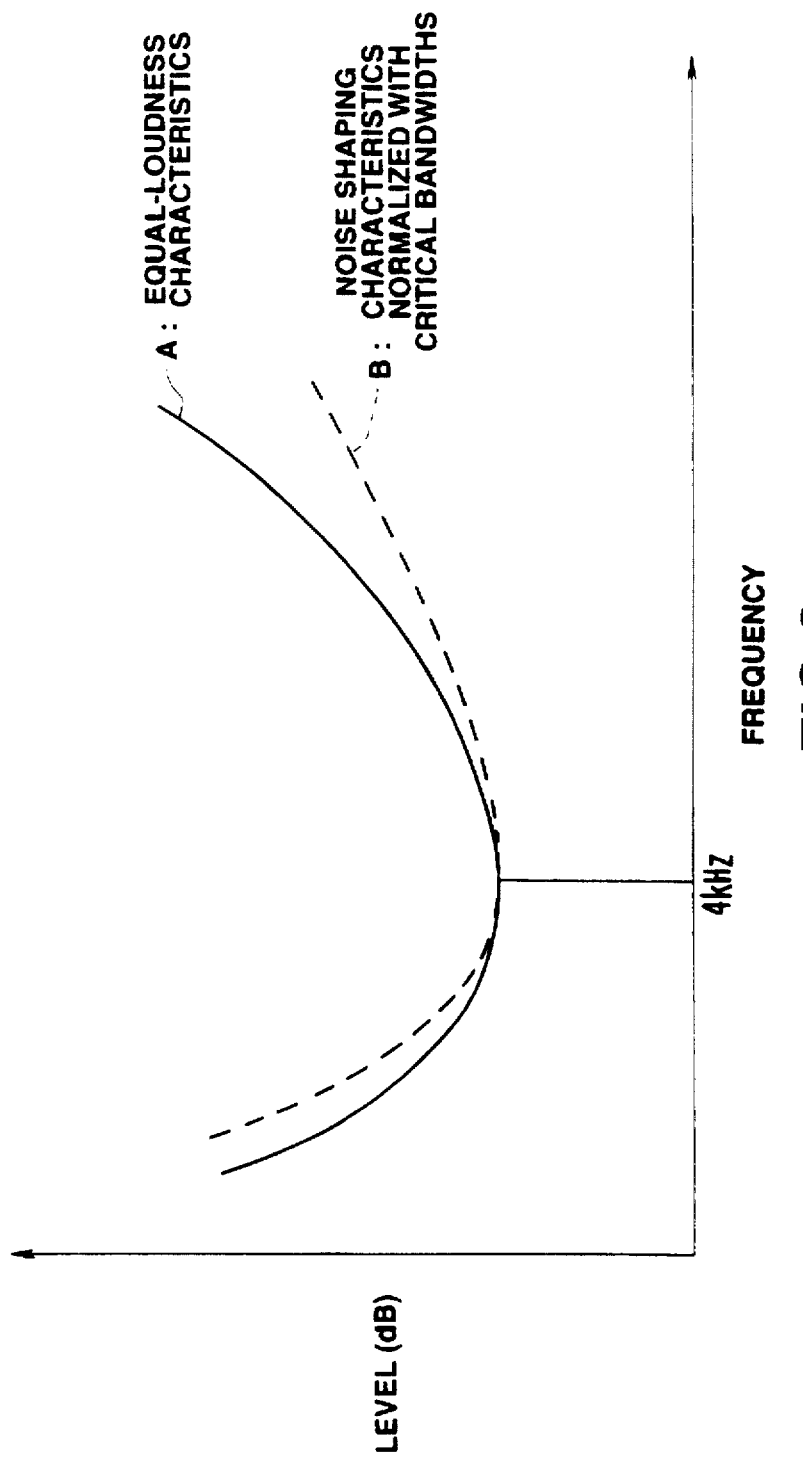
FIG. 3 is a graph showing noise-shaping characteristics for reducing the aurally perceived noise level.

The transfer characteristics of the first-order linear coupled circuit constituting the filter 23 are generally represented as $\Sigma a_n z^{-n}$. The noise-shaping characteristics for a typical set of coefficients of the first-order linear coupled circuit, which represent the equal-loudness characteristics normalized by the critical band width, are shown in FIG. 3, in which curves A and B denote the equal-loudness characteristic curve and the noise-shaping characteristic curve normalized with the critical band widths, respectively.

That is, the equal-loudness characteristics A and the noise shaping characteristics B represent the subjective magnitude of sine wave signals at each frequency and the noise spectrum, respectively. Consequently, it becomes necessary to establish the relation of matching between the subjective magnitude of the sine wave signals and the subjective magnitude of the noise. This may be achieved by relying upon the concept of the critical band.

That is, the noise shaping characteristics capable of affording the noise spectrum matched to the equal loudness characteristics may be obtained by calculating the pure energy of the noise in each critical band and coinciding the calculated energy with the equal loudness level of the sine waves at the center frequency of each critical band. Since the critical band width becomes broader for the higher frequency, it is unnecessary for the noise shaping characteristics to be increased as strongly as the equal loudness characteristics towards higher frequencies. FIGS. 3 and 4 illustrate typical characteristics and the typical numerical relation between the center frequencies and the bandwidth of the critical bands, respectively.

Figure 5:
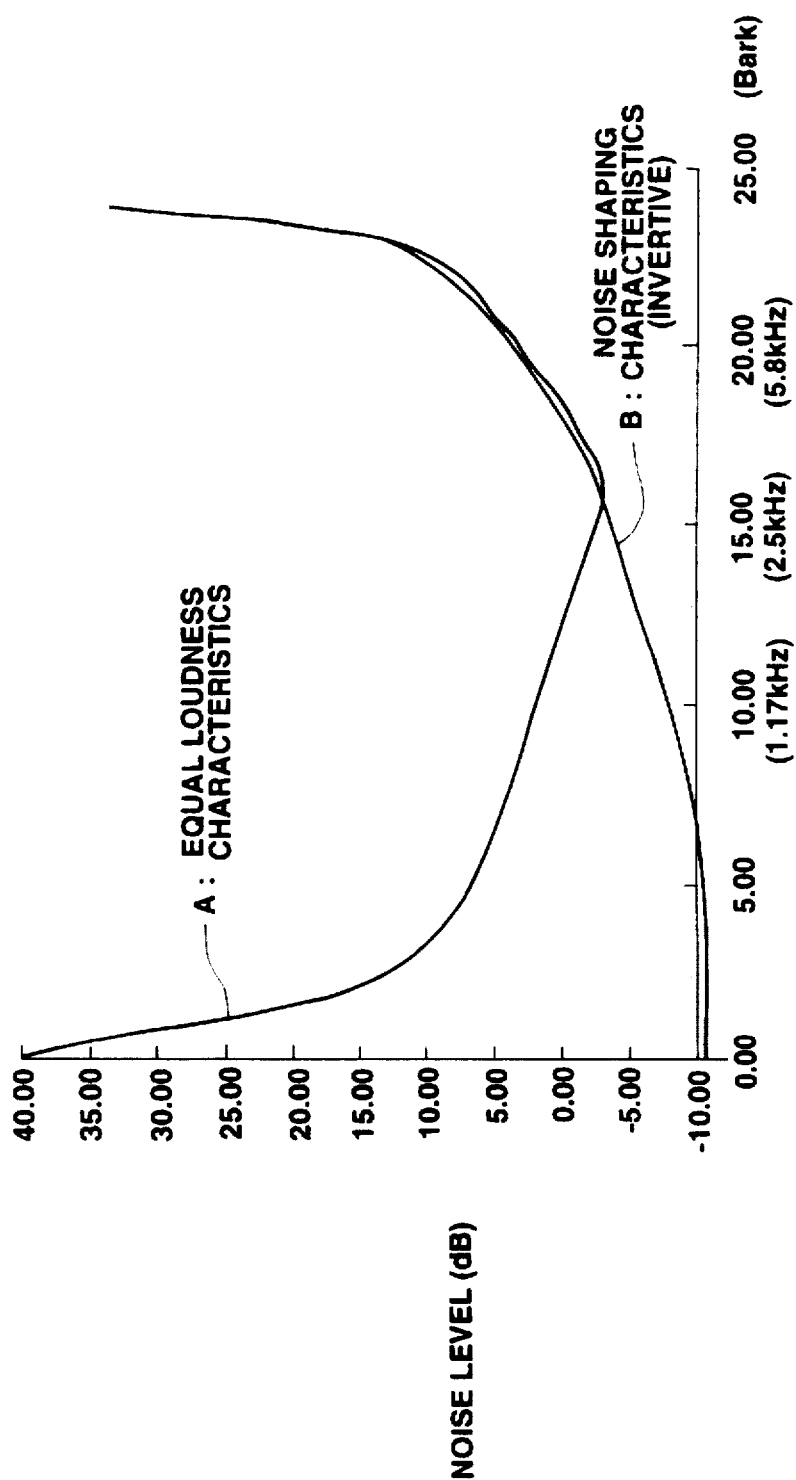
FIG. 5 is a graph showing the relation between the noise shaping characteristics of the embodiments of the present invention and the equal loudness curve as normalized with the bandwidth of the critical bands.

In FIG. 5, in which the critical band numbers (Bark) are plotted on the abscissa, there are shown an equal loudness characteristic curve A normalized with the critical band widths and a noise shaping characteristic curve B according to the present invention. The noise shaping characteristic curve B according to the present invention is adjusted so as to be coincident with the equal loudness characteristic curve at the frequencies approximately equal to 4 kHz and higher. At the frequencies lower than 4 kHz, the noise shaping characteristics may be drawn closer to flatness for lowering the number of orders of the digital filter.

Referring to the drawings, the second embodiment of the present invention will be explained.

Figure 6:
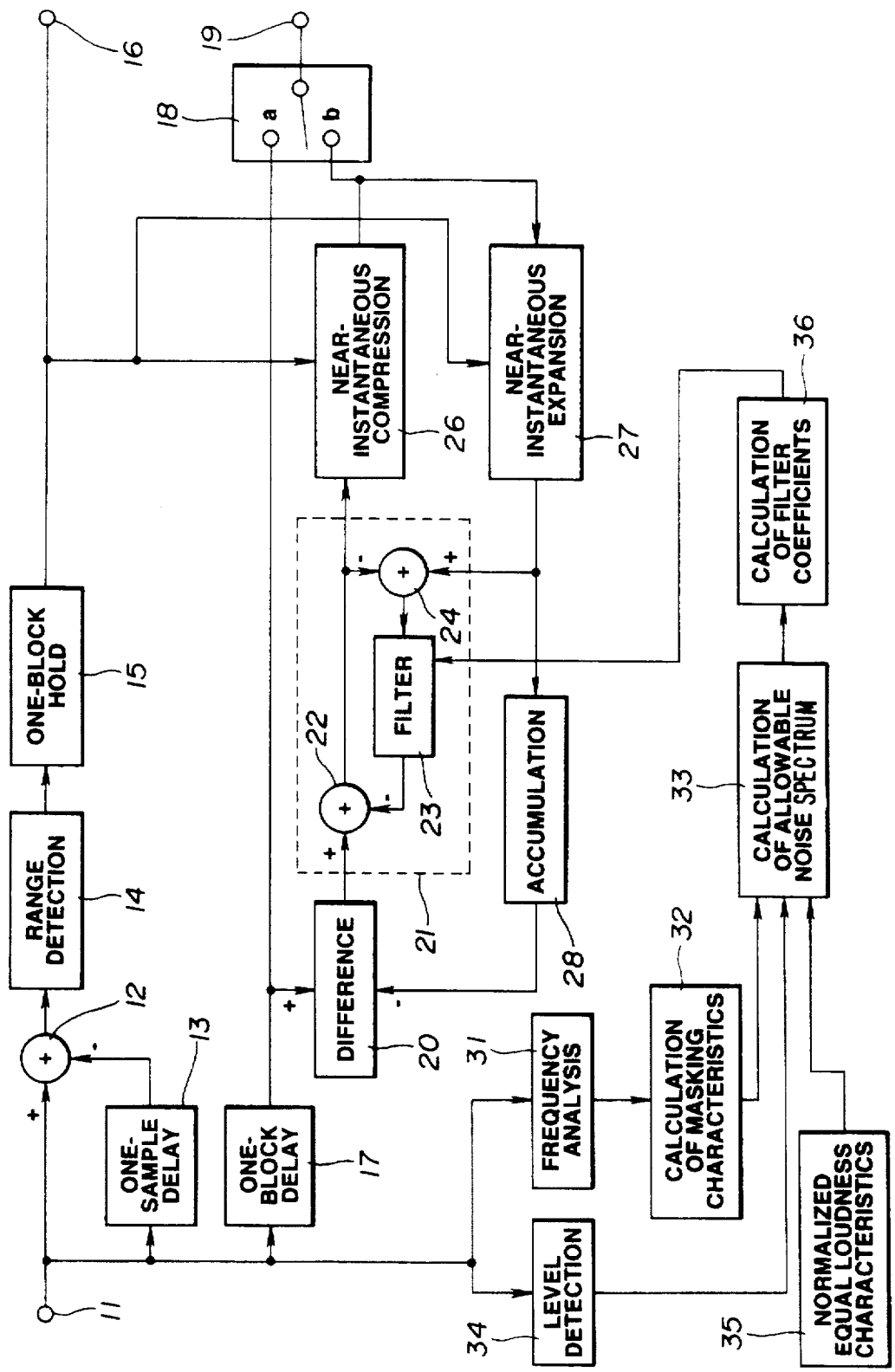
FIG. 6 is a block diagram showing a processing device according to the second embodiment of the present invention in which the equal loudness characteristics and masking characteristics are taken into account.

FIG. 6 shows, in a block diagram, a schematic arrangement of a second embodiment for reducing the quantization errors for audio signals. The device shown in FIG. 6 is a high efficiency encoding device including a noise shaping circuit which also takes the masking effects into account.

The device shown in FIG. 6 is designed to feed back the quantization errors produced in the near-instantaneous compressor 26 to the input side of the near-instantaneous compressor 26 via, among other things, a noise filter 23, and comprises a level detection unit 34 for detecting the level of the input audio signal, a frequency analysis unit 31 for performing frequency analysis of the input audio signal from one critical band to another, an equal loudness curve generating unit 35 for generating the information conforming to the human auditory sense based on the so-called equal loudness curve shown in FIG. 5, and an allowable noise spectrum calculating unit 33 for changing the synthesis ratio between the output of the equal loudness curve generating unit 35 and the output of the masking characteristic processing unit 32 for realization of the optimum quantization noise spectrum by the output of the frequency analysis unit 31 depending on the output of the level detecting unit 34 for calculating the allowable noise spectrum based on the resulting synthesis information. The device shown in FIG. 6 is designed to set the filter characteristics of the noise filter 23 based on the output information of the allowable noise spectrum calculating unit 33.

That is, in the present embodiment, a so-called error feedback circuit is made up of the subtractive node 24 for subtracting the input to the near-instantaneous compressor 26 from the output of the near-instantaneous expander 27 for producing a quantization error generated at the time of quantization at the quasi-instantaneous compressor 26, the noise filter 23 for filtering the output of the subtractive node 24 to output the filtered output, and an additive node (subtractive node) 22 for adding the output of the noise filter 23 to the input of the near-instantaneous compressor 26. The filter characteristics of the noise filter 23 are determined by calculating filter coefficients by a filter coefficient calculating unit 36 based on the information of the allowable noise spectrum information of the allowable spectrum calculating unit 33 as later explained and by transmitting the filter coefficient information to the noise filter 23. Thus the error feedback circuit performs the quantization error reducing operation (so-called noise shaping) based on the allowable noise spectrum, as later explained, and the output of the error feedback circuit is subsequently issued at an output terminal 19. The construction and the operation are otherwise the same as that of the first embodiment shown in FIG. 2 so that the corresponding parts are indicated by the same numerals and the corresponding description is omitted.

Meanwhile, when the quantization error reducing operation (noise-shaping operation) is to be performed by the above-described error feedback circuit, the dynamic range of the audio signals as perceived by the human aural sense may be increased by a processing which takes the masking of the input signal spectrum into account. As the noise shaping taking the masking into account, there are a noise shaping conforming to the signal spectrum of the input audio signal having a more or less fixed pattern, that is a noise shaping which makes use of the allowable noise spectrum produced by taking the so-called masking of the input audio signal spectrum into account, and a noise shaping which makes use of the allowable noise spectrum which is adapted to changes in the spectrum of the input audio signals and which is obtained by taking the masking of the spectrum into account.

By the masking is meant the phenomenon in which, owing to the aural feature of a human being, a signal becomes masked by another sound and becomes inaudible. Among the masking effects, there are a masking effect on signals on the time domain and a masking effect on signals on the frequency domain, that is a concurrent masking or a temporal masking. Due to the masking effects, any noise present in a masked region becomes inaudible.

Figure 7:
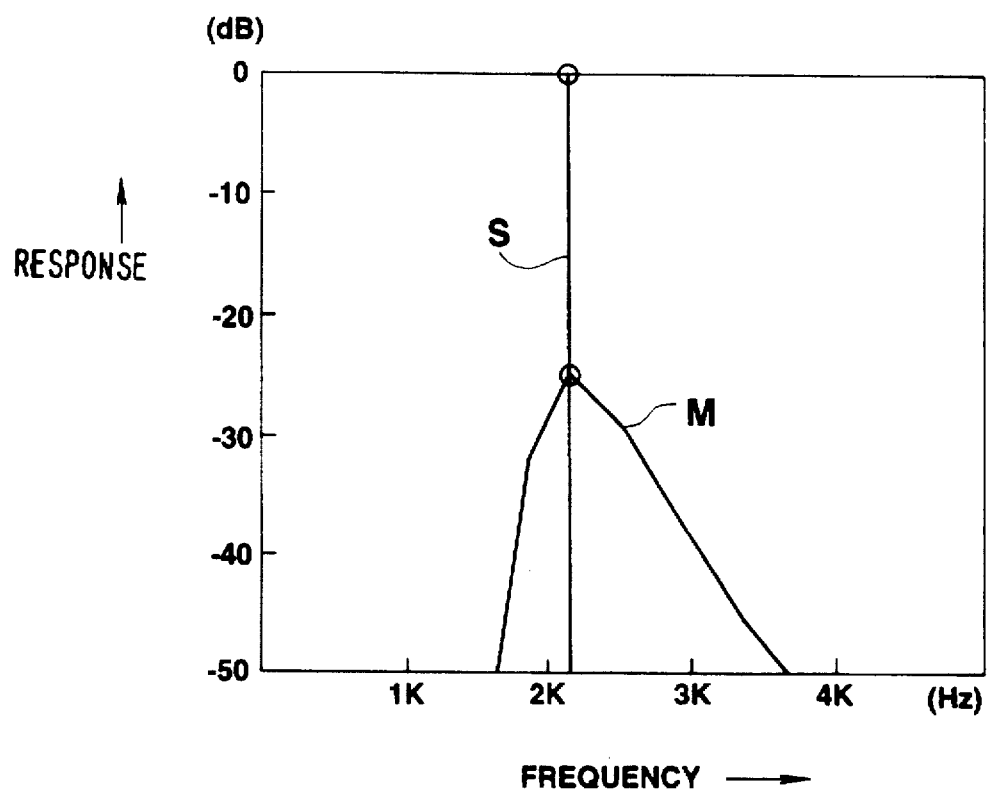
FIG. 7 is a graph showing masking characteristics for a sine wave input.

As for the concurrent masking effect as shown in FIG. 7, if the frequency response of a signal S at a given frequency is 0 dB, a masking effect acts in a region below a curve M (for approximately −25 dB or lower) by the signal S. Besides, if the input signal is segmented according to the critical bands to take advantage of the auditory sense characteristic of a human being and the noise shaping is performed by employing the allowable noise spectrum taking the above-mentioned masking into account for each critical band, the noise shaping which is more effective for the auditory sense characteristic of a human being may be achieved. It becomes possible in this manner to improve the dynamic range of the reproduced sound as perceived by the ears.

Thus the frequency analysis unit 31 segments the input audio signals by the so-called critical bands by taking advantage of characteristics of the human auditory sense and performs frequency analysis for each of the critical bands. In segmenting the input audio signal by the critical bands, it is possible to translate the input audio signal into components on the frequency domain (FFT coefficients) by e.g. the fast Fourier transform (FFT) and to classify the amplitude terms Am of the FFT coefficients, m being 0 to 1024, into e.g. 25 bands or groups Gn, n indicating the band or group numbers and being 0 to 24, in accordance with the above-mentioned critical band widths which become broader towards higher frequencies for taking account of the characteristics of the human auditory sense.

By way of the frequency analyses for each of the critical bands, a so-called Bark spectrum Bn or the spectrum of total sums, which may be found by finding the total sum of the amplitude terms Am (total sum of the peaks, mean values or energies) for the respective bands, may also be found in accordance with the equation (1):

$$Bn = 10 \log 10 \, Cn(Pn)2 \, dB \tag{1}$$

Figure 8:
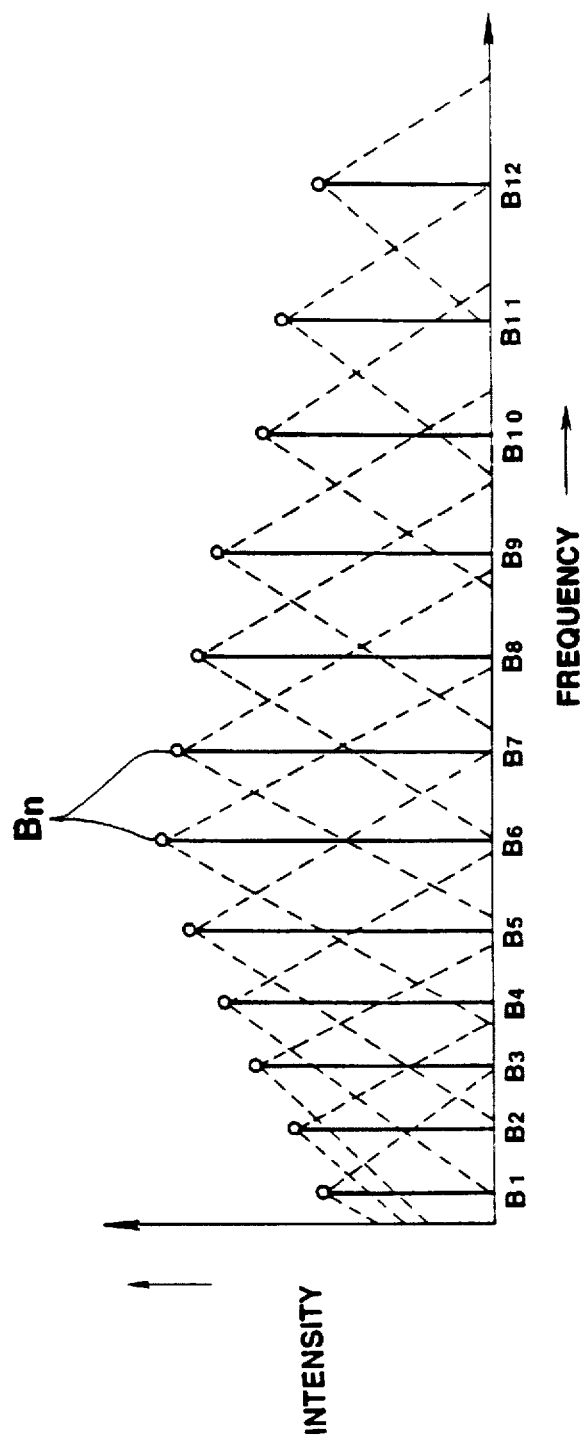
FIG. 8 is a graph showing masking characteristics by plural spectral components.

In the equation (1), n=0 to 24, Cn is the number of elements that is the amplitude terms (number of points) in the n'th band, and Pn is the peak value for the respective bands. A typical Bark spectrum for the respective bands is shown in FIG. 8, in which the number of the critical bands is set to 12 (B1 to B12) for brevity. The frequency analysis unit 31 performs the division by the critical bandwidth and the frequency analysis from one critical band to another and transmits the output information to the masking characteristics calculating unit 32.

Figure 9:
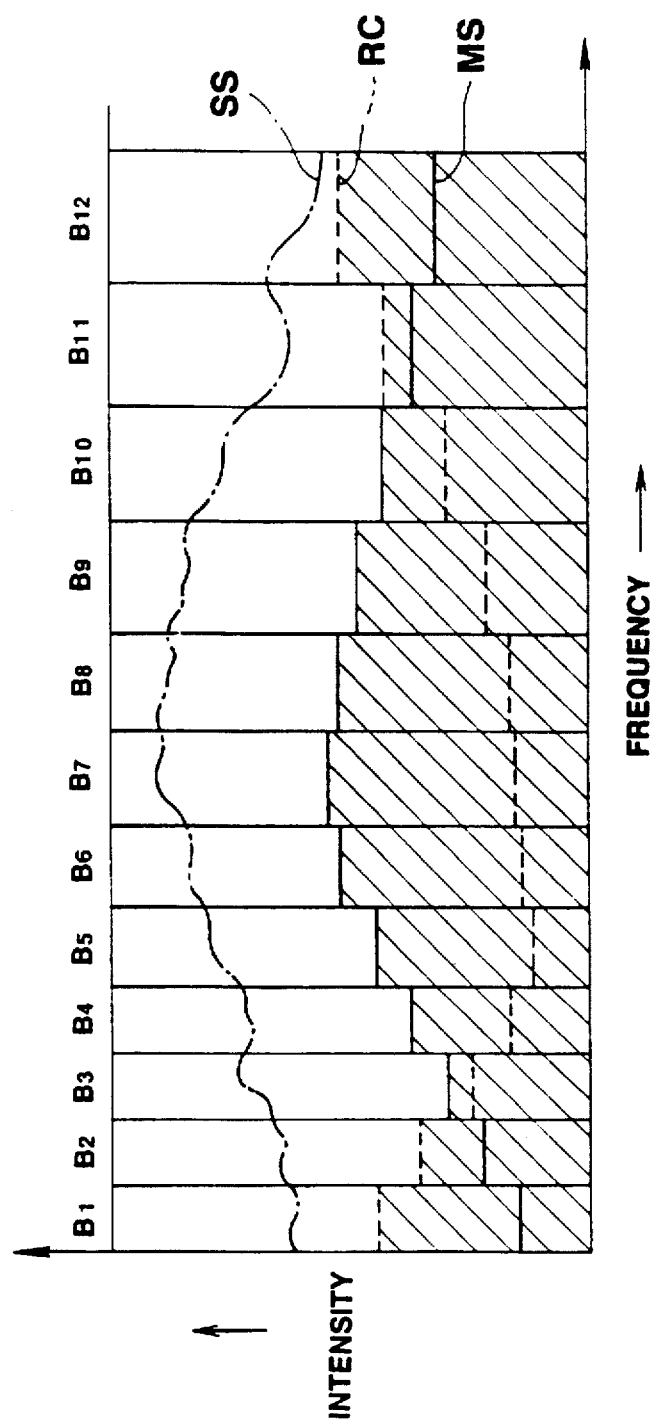
FIG. 9 is a graph showing equal loudness characteristics and comprehensive masking characteristics by plural spectral components.

The equal loudness curve generating unit 35 generates and outputs the information which is the equal loudness curve normalized with the critical bandwidth. The equal loudness curve represents aural characteristics of human being and is obtained by interconnecting the sound pressures of the sounds at the respective frequencies heard with the equal loudness as a pure sound of 1 kHz. It is also known as the equal loudness sensitivity curve. As shown by a curve RC of FIG. 9, representing the equal loudness curve, the hearing power of human being is strongest in the vicinity of 4 kHz, such that the sound of 4 kHz is heard with substantially an equal loudness as the 1 kHz sound even if the sound pressure is lower by e.g. 8 to 10 dB than the 1 kHz sound, while the sound of e.g. 10 kHz is less audible by about 20 dB than the 4 kHz sound. Consequently, the dynamic range of the reproduced sound as perceived by the ear may be improved by noise shaping the audio signals by the error feedback circuit based on the curve RC which is the equal loudness curve normalized with the critical bandwidth.

That is, by performing the noise shaping using the allowable noise spectrum obtained by taking into account the curve RC which is the equal loudness curve normalized with the critical bandwidth, noise shaping more effective in view of the aural sense of human being may be realized to improve the dynamic range of the reproduced sound as heard by the listener. The information concerning the curve RC, which is the equal loudness curve normalized with the critical bandwidth as perceived by the ear, or a curve approximated to the curve RC, is outputted by the equal loudness curve generating unit 35 so as to be supplied to the allowable noise spectrum calculating unit 33.

The allowable noise spectrum calculating unit 33 calculates the allowable noise spectrum based on the output information from the equal loudness curve generating unit 35 and the output information of the masking characteristics calculating unit 32. At this time, the Bark spectral components Bn for the respective critical bands produced by the frequency analysis unit 31 are convolved to take into account the effects of the neighboring bands in accordance with equation (2)

$$Sn = Hn * Bn \quad (2)$$

wherein Hn denotes convolution coefficients, for calculating the convolved Bark spectrum Sn for the respective bands.

By the convolution, the sum total of dotted-line portions in FIG. 8 is found. Then, using the convolved Bark spectrum Sn and the S/N value On as required, n being equal to 0 to 24, the masking threshold Tn resulting from convolution is calculated by equations (3) and (4):

$$On = K - Kxn \quad (3)$$

$$Tn = Sn - On \quad (4)$$

Figure 10:
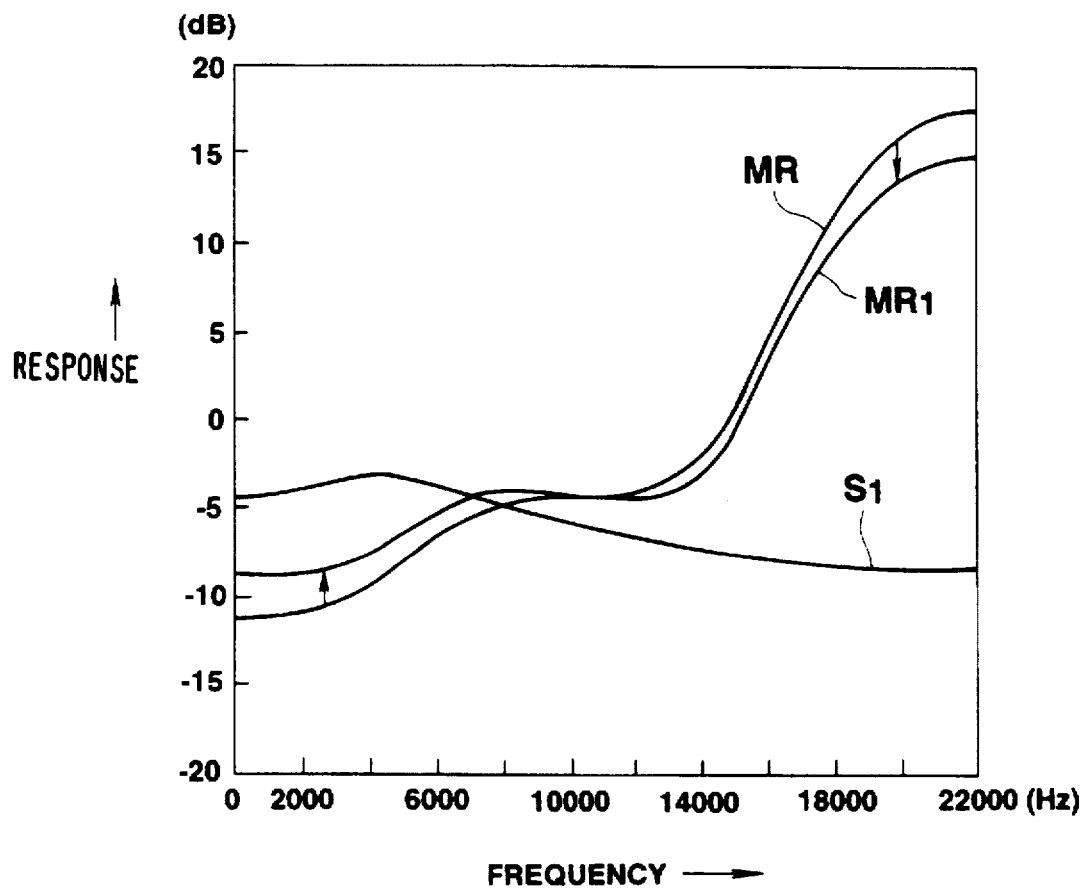
FIG. 10 is a graph showing a frequency response for low-range input signals having a slightly high signal level.

For example, it can be set that K=1 for N=38, in which case the deterioration in the sound quality is diminished. That is, as shown in FIG. 10, the level lower than the levels of the convolved masking threshold Tn is masked. The convolved masking threshold Tn is subsequently deconvolved by equation (5):

$$TFn = Tn - Dn \quad (5)$$

to calculate the allowable noise level (allowable noise spectrum) TFn. In effect, the dc gain Dn of the convolution by the coefficient Hn is subtracted from Tn.

The allowable noise spectrum calculating unit 33 calculates the allowable noise spectrum based on the information obtained by combining the output information of the masking characteristic calculating unit 32 with the output information of the equal loudness curve generating unit 35.

Meanwhile, it may occur that the allowable noise level with the allowable noise spectrum based on the curve RC which is the equal loudness curve normalized by the critical bandwidth becomes lower than the allowable noise level by the masking effects which depends on the input signal level. That is, with the higher input audio signal level, it may occur that the level of the allowable noise level based on the equal loudness curve is simultaneously masked by the allowable noise level by the masking effect which depends on the input audio signal.

Thus, with the present embodiment, the input audio signal level is detected by the level detecting unit 34 and the synthesis ratio of the output information of the equal loudness curve generating unit 35 and the output information of the masking characteristic calculating unit 32 is changed depending on the detected output level. It is noted that the synthesis of the output information of the equal loudness curve generating unit 35 and the output information of the masking characteristic calculating unit 32 is carried out from band to band. In such case, level detection by the level detection unit 34 is also made from band to band so that the synthesis ratio is changed from band to band depending on the band-based detected output level. That is, if the low-range input audio signal is high such that the masking effect for the low-frequency range is high, the synthesis ratio employed for producing the synthesis information for finding the allowable noise spectrum by the allowable noise spectrum calculating unit 33 is of such a value as to give an allowable noise spectrum which is high for the low frequency range and which is low for the high frequency range.

Conversely, if the high-range input audio signal is high such that the masking effect for the high-frequency range is high, the synthesis information is produced by the synthesis ratio which will give an allowable noise level which becomes high and low for the high and low frequency ranges, respectively. The information of the allowable noise spectrum, produced in this manner, is transmitted to the filter coefficient calculating unit 36 from which filter coefficients conforming to the allowable noise spectrum are outputted and transmitted to the noise filter 23.

In this manner, the filter coefficients as filtering properties of the noise filter 23 are based on the allowable noise spectrum obtained by changing the synthesis ratio from band to band depending on the input signal level. It is now assumed that for a flat input audio signal level, the noise filter 23 is of filtering characteristics shown by a curve MR in FIGS. 10 to 13. If the input audio signal becomes a signal S1 having a slightly nigh level at a lower frequency, as shown in FIG. 10, the filtering characteristics are changes to those in which the high-range response and the low-range response are lowered and raised slightly from the curve MR, respectively, as shown by a curve MR1 in FIG. 10, by changing the synthesis ratio as mentioned above.

Figure 11:
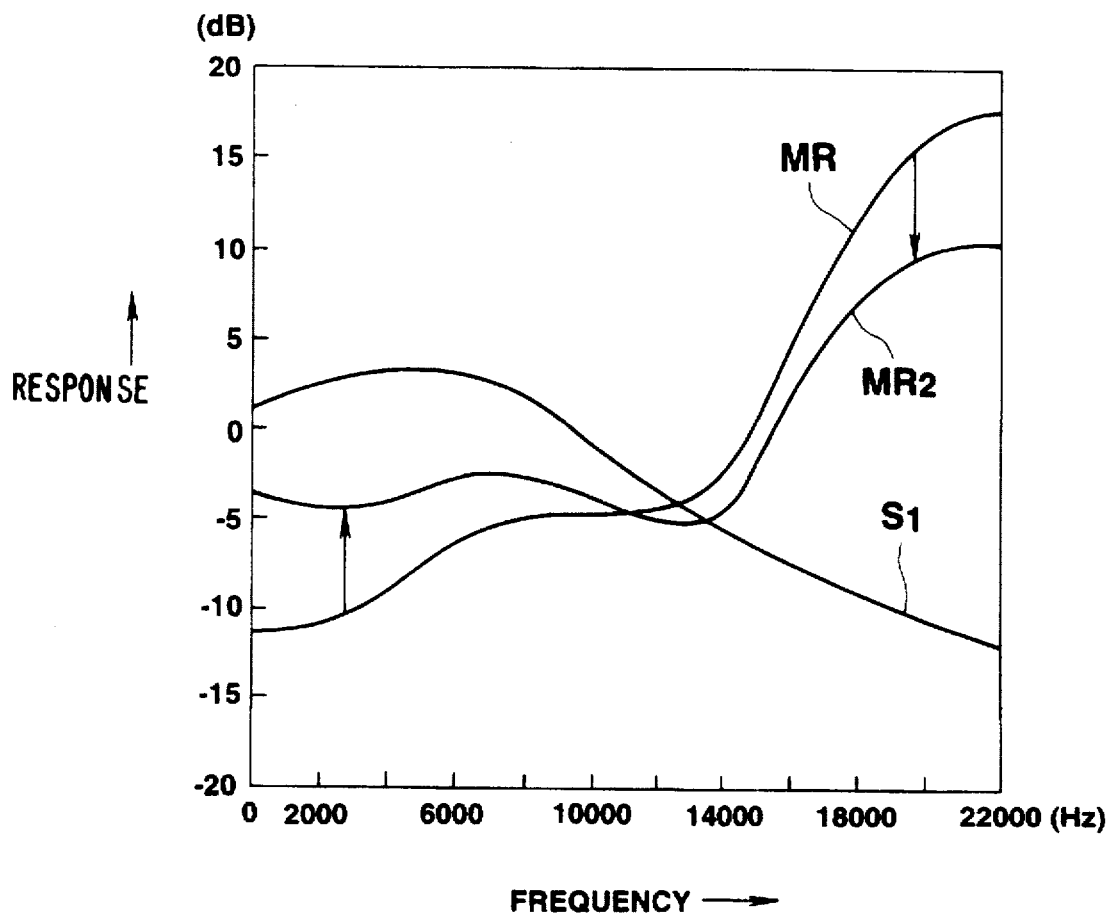
FIG. 11 is a graph showing a frequency response for low-range input signals having a high signal level.
Figure 12:
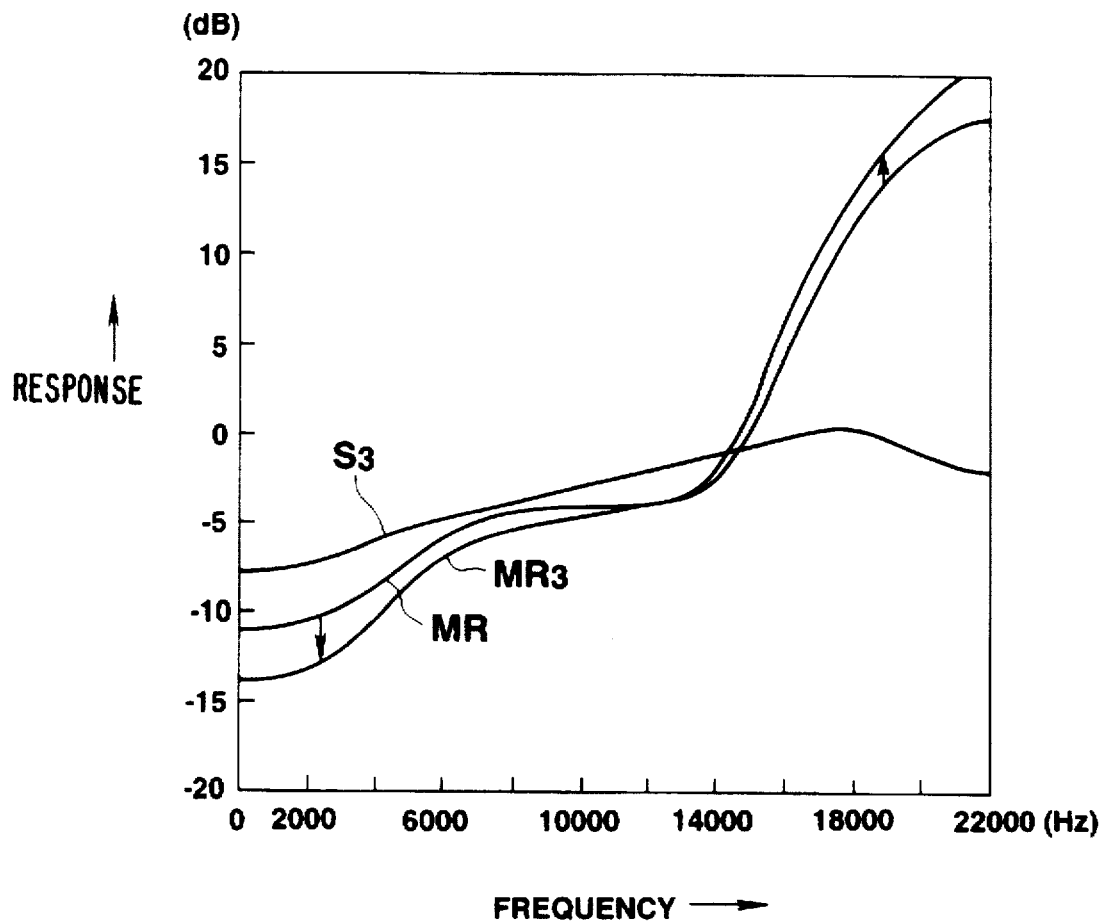
FIG. 12 is a graph showing a frequency response for high-range input signals having a slightly high signal level.
Figure 13:
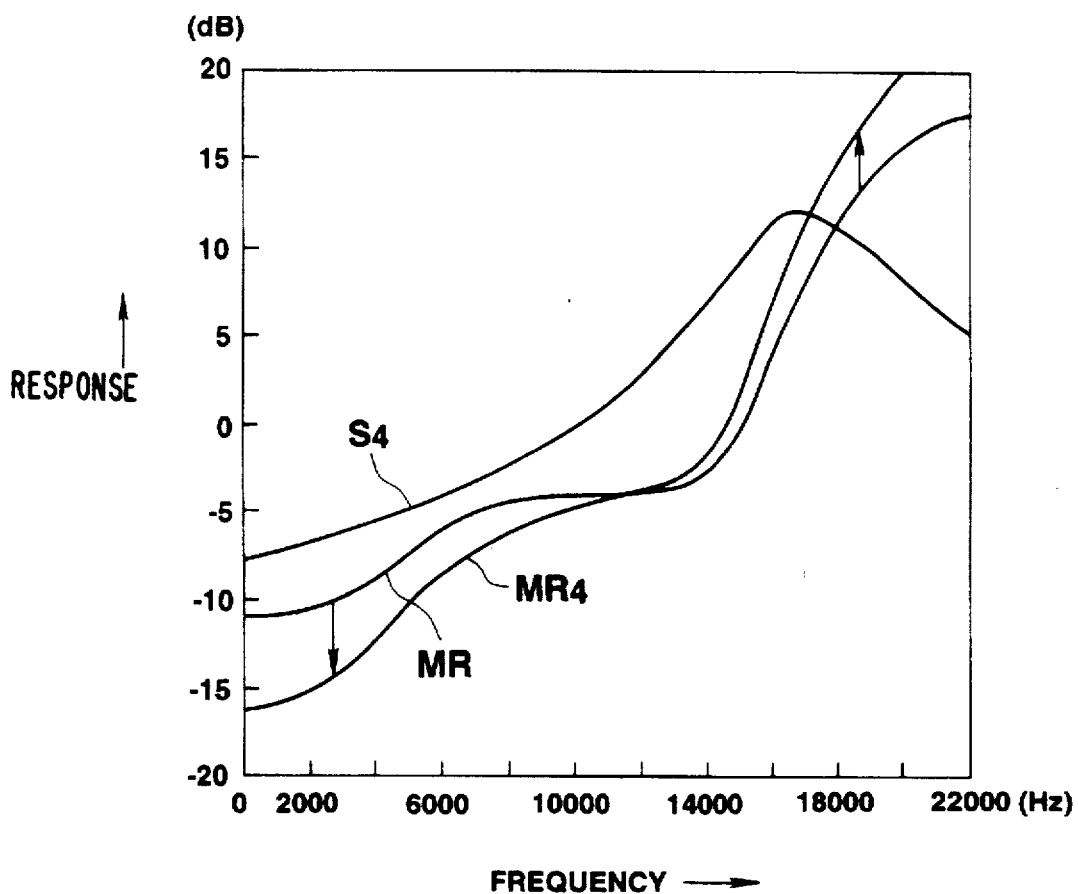
FIG. 13 is a graph showing a frequency response for high-range input signals having a high signal level.

On the other hand, if the input audio signal becomes a signal S2 having a high level at a lower frequency, as shown in FIG. 11, the filtering characteristics of the noise filter 23 are changed to those in which the high-range response and the low-range response are lowered and raised significantly from the curve MR, respectively, as shown by a curve MR2 in FIG. 10. Conversely, if the input audio signal becomes a signal S3 having a slightly high level at a higher frequency, as shown in FIG. 12, the filtering characteristics are changed to those in which the high-range response and the low-range response are raised and lowered slightly from the curve MR, respectively, as shown by a curve MR3 in FIG. 12. If the input audio signal becomes a signal S4 having a high level at a higher frequency, as shown in FIG. 13, the filtering characteristics of the noise filter 23 are changed to those in which the high-range response and the low-range response are raised and lowered significantly from the curve MR, respectively, as shown by a curve MR4 in FIG. 13. By changing the filtering characteristics s shown in FIGS. 10 to 13, the noise shaping may be achieved which is matched more closely to the aural sense of a human being.

In other words, with the present embodiment, the filtering characteristics represented by the curve RC which is the equal loudness curve normalized with the critical bandwidth are used as the filtering characteristics of the noise filter 23, as long as the input audio signal level is low, by way of nose shaping. As the signal level becomes higher, the noise filter characteristics are rendered flatter to match the noise filter characteristics to the signal level of the input audio signal to render the quantization noise less outstanding by the input audio signal level.

Besides, if the input signal level is low, the filtering characteristics as represented by the curve RC are rendered flatter by the noise filter 23 to conform to the input signal level for changing the noise shaping characteristics, such as masking characteristics, into conformity with the input signal characteristics. That is, the filtering characteristics as indicated by the curve RC which is the equal loudness curve normalized with the critical bandwidth are employed for the lower input signal level, while the filtering characteristics which take the masking effect into account is employed for the higher input signal level.

As for the curve MR showing filtering characteristics for the flatter input audio signal level shown in FIGS. 10 to 13, it may be contemplated to increase the input signal level, that is to increase the allowable noise level, for the input signal level of not lower than 4 kHz, if the equal loudness curve RC shown in FIG. 9 is taken into account. However, since the region of the equal loudness curve RC not higher than 4 kHz exhibits acute changes despite the narrower bandwidth, the number of orders of the filter is increased if the noise filter 23 is designed for matching the region of the equal loudness curve not higher than 4 kHz to the curve RC which is the equal loudness curve normalized with the critical bandwidth. Since the effects matched to the number of the filter orders are not achieved in this manner, the flatter filtering characteristics are employed in the present embodiment for the range of not higher than 4 kHz as described above.

What is claimed is:

1. A method of processing a digital signal for recording on a record medium, the method comprising the steps of:

receiving an input digital audio signal;

subtracting an error feedback signal from the input digital audio signal to form a first signal;

quantizing the first signal to produce a quantized first signal;

generating a difference signal by taking a difference of the first signal and the quantized first signal; and filtering the difference signal to produce the error feedback signal using a filter with filter characteristics set on the basis of an equal-loudness characteristic normalized over a critical bandwidth of the audio signal.

2. The method according to claim 1, wherein the filter characteristics are set so that a low-frequency band of the filter characteristics is substantially flat.

3. The method according to claim 1, wherein the filter characteristics are set so that the filter characteristics below 4 kHz are substantially flat.

4. The method according to claim 1, further comprising the step of calculating masking characteristics of the input digital audio signal and the step of setting filter coefficients of the filter in response thereto.

5. The method according to claim 4, further comprising the steps of frequency analyzing the input digital audio signal and using the frequency analysis in the step of calculating masking characteristics.

6. The method according to claim 5, wherein the step of frequency analyzing comprises the steps of dividing a bandwidth of the input digital audio signal into a plurality of bands, determining critical bands of the plurality of bands, and performing the step of frequency analyzing for each determined critical band.

7. The method according to claim 6, further comprising the steps of detecting a level of the input digital audio signal and wherein the filter characteristics are set in response to the detected levels in the step of setting.

8. The method according to claim 7, wherein the step of setting filter coefficients includes controlling a ratio of consideration between the analyzed frequency and the detected level for use in setting the filter coefficients.

9. The method according to claim 7, wherein said step of detecting the level is performed for every determined critical band.

10. The method according to claim 9, wherein the step of setting filter characteristics further comprises the step of changing a ratio of consideration for every determined critical band.

11. The method according to claim 10, wherein said step of changing the ratio includes the steps of setting the ratio of consideration of the frequency analysis higher than the level detection when the detected level is low and setting the ratio of consideration of the level detection to be higher when the detected level is high.

12. An apparatus for processing a digital signal for recording on a record medium, the apparatus comprising:

means for receiving an input digital audio signal;

means for subtracting an error feedback signal from the input digital audio signal to form a first signal;

means for quantizing the first signal to produce a quantized first signal;

means for generating a difference signal by taking a difference of the first signal and the quantized first signal; and a digital filter for filtering the difference signal to produce the error feedback signal, the digital filter having filter characteristics set on the basis of an equal-loudness characteristic normalized over a critical bandwidth of the audio signal.

13. The apparatus according to claim 12, wherein the filter characteristics are set so that a low-frequency band of the filter characteristics is substantially flat.

14. The apparatus according to claim 12, wherein the filter characteristics are set so that the filter characteristics below 4 kHz are substantially flat.

15. The apparatus according to claim 12, further comprising means for calculating masking characteristics of the input digital audio signal and means for setting coefficients of said filter in response thereto.

16. The apparatus according to claim 15, further comprising means for frequency analyzing the input digital audio signal and supplying the frequency analysis to said means for calculating masking characteristics.

17. The apparatus according to claim 16, wherein said means for frequency analyzing comprises means for dividing a bandwidth of the input digital audio signal into a plurality of critical bands, so that said means for frequency analyzing analyzes each critical band.

18. The apparatus according to claim 17, further comprising means for detecting a level of the input digital audio signal and wherein the filter characteristics are set in response to the detected levels by the means for setting coefficients.

19. The apparatus according to claim 18, wherein said means for setting the filter coefficients includes means for controlling a ratio of consideration between the analyzed frequency and the detected level for use in setting the filter coefficients.

20. The apparatus according to claim 19, wherein said means for controlling a ratio sets the ratio of consideration of the frequency analysis higher than the level detection when the detected level is low and sets the ratio of consideration of the level detection to be higher when the detected level is high.

* * * * *